United States Patent
Park et al.

(10) Patent No.: US 7,303,648 B2
(45) Date of Patent: Dec. 4, 2007

(54) VIA ETCH PROCESS

(75) Inventors: Hyun-Mog Park, Portland, OR (US); Vijayakumar Ramachandrarao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 41 days.

(21) Appl. No.: 10/854,541

(22) Filed: May 25, 2004

(65) Prior Publication Data
US 2005/0274690 A1    Dec. 15, 2005

(51) Int. Cl.
*H01L 21/3065* (2006.01)
(52) U.S. Cl. .................... 156/345.24; 156/345.25; 438/714; 438/701; 438/640; 438/638; 438/734; 438/978; 216/17; 204/192.1
(58) Field of Classification Search ........... 156/345.24, 156/345.25, 345.26, 345.28; 118/712; 438/714, 438/701, 640, 638, 734, 978; 216/17, 18; 204/192.1
See application file for complete search history.

(56) References Cited

U.S. PATENT DOCUMENTS 5,702,562 A * 12/1997 Wakahara ................. 216/60

FOREIGN PATENT DOCUMENTS

JP        10335309 A   * 12/1998

OTHER PUBLICATIONS

Ping Wang, "Aniso-/Iso-/Anisotropic Via Process for Submicron Device Metal Interconnect", Motorola Inc., Technical Developments; vol. 19, Jun. 1993, pp. 146-147.

* cited by examiner

*Primary Examiner*—Ram N. Kackar
(74) *Attorney, Agent, or Firm*—Fish & Richardson P.C.

(57) ABSTRACT

Systems and techniques relating to etching vias in integrated circuit devices, in one implementation, include: providing a dielectric material and a conductive material, removing a first portion of the dielectric material to form a hole in the dielectric material, performing a tapering etch that removes a second portion of the dielectric material to form a via that touches down on the conductive material, and laterally expanding a bottom dimension of the via without a significant increase in a depth of the via. The technique can also include: providing a substrate with the dielectric material and the conductive material attached without an associated etch stop layer, removing the first portion at a high etch rate, controlling ion bombardment and plasma chemistry to form a sloped bottom of the via, and performing an intensive ion bombarding plasma etch, laterally expanding the via bottom.

10 Claims, 3 Drawing Sheets

VIA ETCH PROCESS

BACKGROUND

The present application describes systems and techniques relating to etching vias in integrated circuit devices, for example, a method of plasma etch for etch stop-less integration.

A conventional via etch process typically has two operations. A bulk of the dielectric material is first removed with a high etch rate. Then, the remaining dielectric material is removed with higher selectivity etching of the ILD (Interlayer dielectric) when compared to the underlying etch stop layer. In an effort to improve device performance, lower dielectric constant ILD material has been explored to replace a more conventional Oxide-based ILD.

DRAWING DESCRIPTIONS

Figure 1:
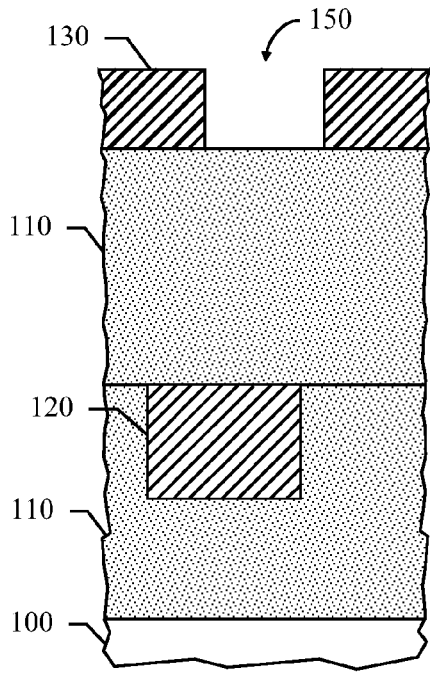
FIGS. 1-4 illustrate a plasma etch process for etch stop-less integration that minimizes probability of an un-landed via problem.
Figure 2:
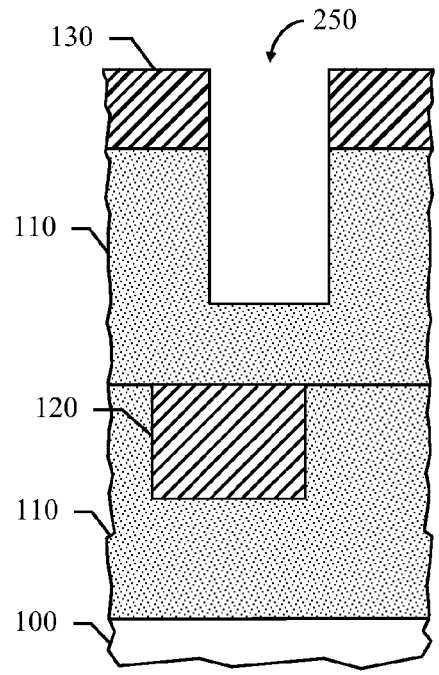
Figure 3:
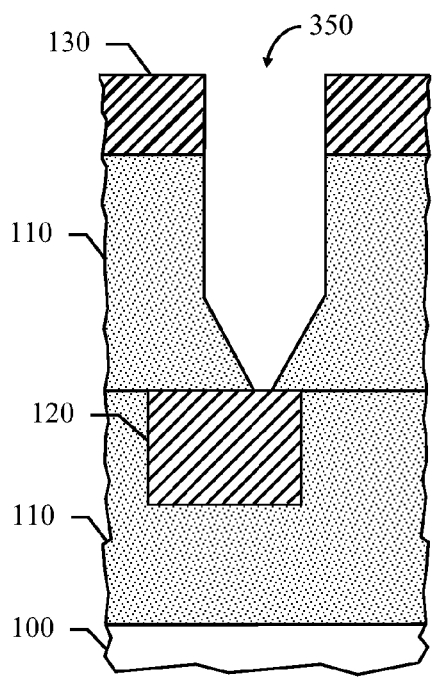
Figure 4:
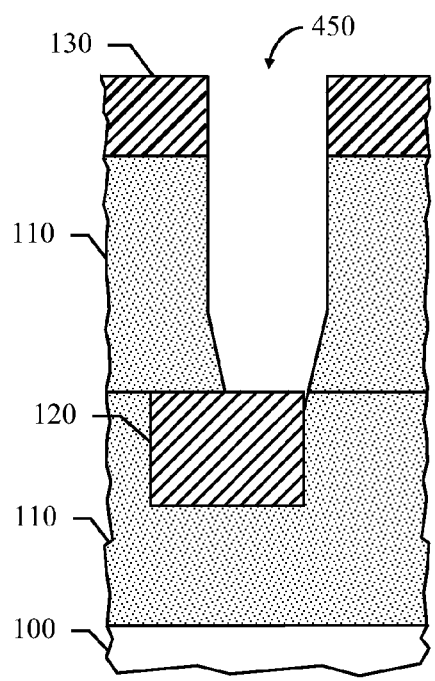

Details of one or more embodiments are set forth in the accompanying drawings and the description below. Other features and advantages may be apparent from the description and drawings, and from the claims.

DETAILED DESCRIPTION

One of the contributing factors to the overall dielectric constant of a semiconductor device is the etch stop layer, since its dielectric constant is generally higher than that of the ILD. Thus, etch stop-less integration, with the total removal of the etch stop layer, has been considered as a possibility for lowering the overall dielectric constant.

FIGS. 1-4 illustrate a plasma etch process for etch stop-less integration that minimizes the probability of an un-landed via problem. Due to the incoming film thickness variation and etch rate variation, a timed via etch involves some amount of over etch time. This over etch time ensures that the via is completely etched and stopped on a conventional etch stop layer. In the etch stop-less integration case, if there is misalignment error in the via lithography process, the via can readily etch into the underlying ILD material. An un-landed via, also called a micro-via, results, as the portion of the via that was over etched into the underlying ILD. This can create significant challenges to device performance due to the micro-via's very small dimension and high aspect ratio. For example, in some VLSI (very-large-scale integration) processes, a created micro-via may be around 200 nanometers (nm) deep and 30 nm wide.

These challenges can be readily identified in barrier/seed layer deposition and copper (Cu) electroplating processes. For example, due to the very small dimensions and high-aspect ratio, a micro-via is unlikely to be fully filled with barrier layer and Cu. The void in the un-landed via can cause device reliability issues and should thus be minimized.

FIGS. 1-4 show a substrate 100 with a dielectric material 110 and a conductive material 120. The dielectric material 110 may be a low dielectric constant dielectric material, the conductive material 120 may be a metal material, and the dielectric material and the conductive material may have no associated etch stop layer supporting selective etching of the dielectric material. A mask layer 130 (e.g., a photo resist) defines a hole 150 that corresponds to the width (often called the critical dimension (CD)) of the via to be created.

In a first operation, a first portion of the dielectric material 110 is removed to form a hole 250 in the dielectric material 110. This can involve removing the first portion at a high etch rate, forming a substantially vertical sidewall profile (e.g., less than 15 degrees deviation from vertical).

In a second operation, a tapering etch that removes a second portion of the dielectric material 110 is performed, resulting in a via 350 that touches down on the conductive material 120. This can involve controlling ion bombardment and plasma chemistry to form a sloped bottom of the via. For example, polymer can be deposited on the via sidewall to create a "V" shape at the bottom of the via 350, which can involve reducing power and adding more fluorocarbon gas to the plasma chemistry in a parallel plate etcher.

In a third operation, a bottom dimension of the via is laterally expanded without a significant increase in a depth of the via 450 (e.g., expanding the bottom dimension by an amount without increasing the depth of the via more than two or three times the amount). This can involve performing an intensive ion bombarding plasma etch, increasing the CD at the via bottom, which impacts device speed. For example, power can be increased and fluorocarbon gas reduced in a parallel plate etcher. By controlling the lateral expansion operation in the via etch process, the bottom via size can be increased enough to make the bottom CD a reasonable size that does not impact device performance while also minimizing the probability of creating an un-landed via problem.

Figure 5:
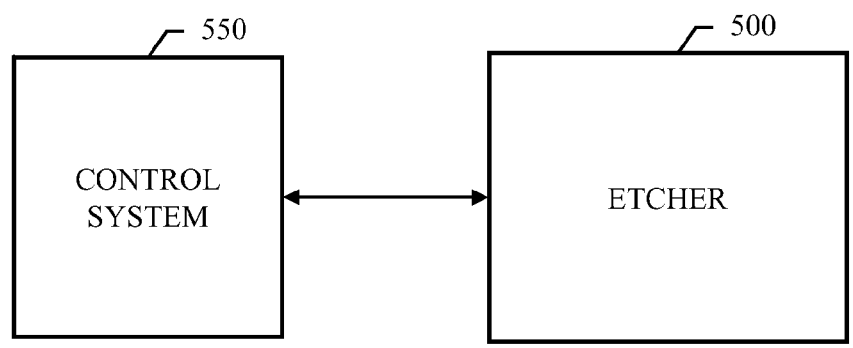
FIG. 5 illustrates a system that employs the plasma etch process.

FIG. 5 illustrates a system that employs the plasma etch process. The system includes an etcher 500 and a control system 550. The control system 550 can be a programmed computer control system that operates the etcher 500 and receives information from the etcher to be used in adjusting control parameters. The control system 550 performs the operations as described above, can perform these as timed etch operations, and can form a via of less than 350 nm in width.

Figure 6:
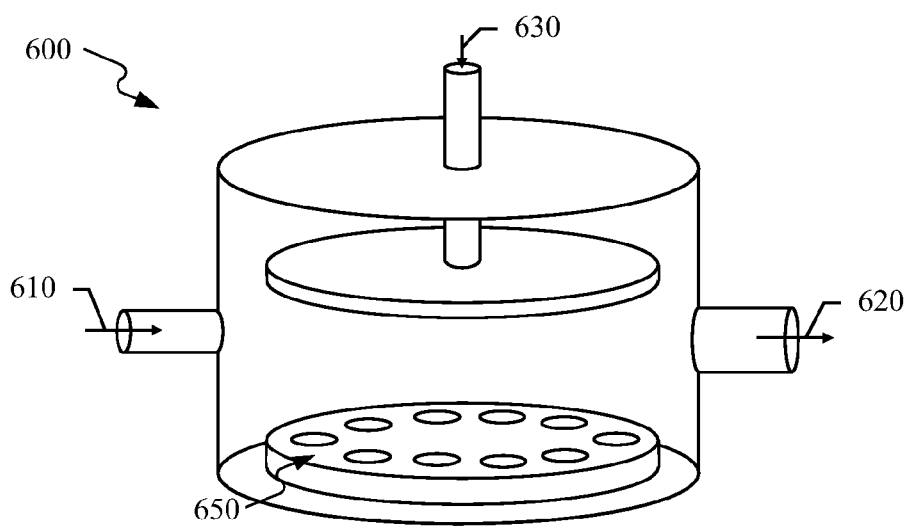
FIG. 6 illustrates an example plasma etcher as can be used in the system of FIG. 5.

FIG. 6 illustrates an example plasma etcher that can be used in the system of FIG. 5. A parallel plate etcher 600 includes a gas source 610, a gas outlet 620 and a power control 630. Wafers 650 can be placed in the parallel plate etcher 600 and etched as described above.

Figure 7:
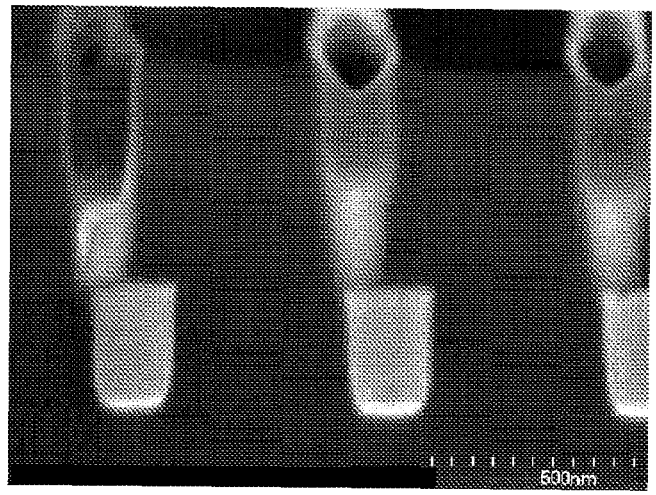
FIGS. 7-8 illustrate example vias etched using the described plasma etch process.
Figure 8:
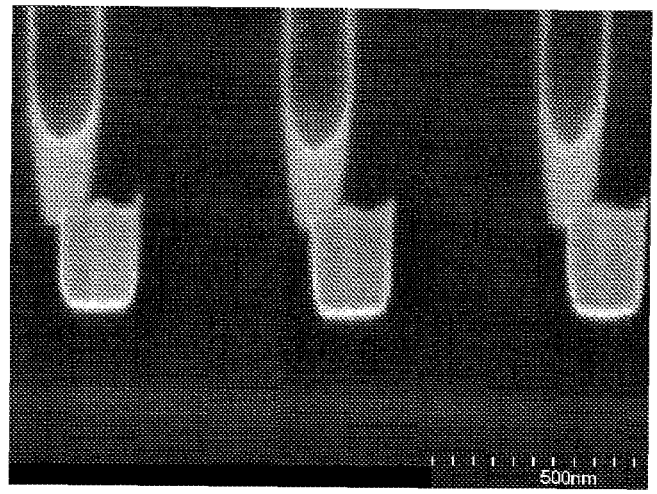

FIGS. 7-8 illustrate example vias etched using the described plasma etch process. A scanning electron microscope (SEM) micrograph 700 (with a marked scale of 500 nm) illustrates vias that have been fully landed on the underlying metal after the first and second operations. However, the size of the vias contacting the metal trench is smaller than needed for the via bottom CD, due to the via tapering.

A SEM micrograph 800 (with a marked scale of 500 nm) illustrates the vias after the third operation. The via bottom CD has been increased by 25 nm. As shown, a slight un-landed via is still present in this example, but the un-landed via depth is shallower and relatively wider than the un-landed via that would occur without these techniques being used in an etch stop-less integration implementation.

Using the systems and techniques described can result in the creation of low dielectric constant materials to improve performance and propagation of future integrated circuits. For example, integrated circuits can be created with reduced intraline capacitance, crosstalk noise and power consumption.

Other embodiments may be within the scope of the following claims.

What is claimed is:

1. A system comprising:
an etcher; and
a control system programmed to cause the etcher to form a via through a dielectric material to a conductive material while preventing creation of a micro-via having a high aspect ratio in a case of via formation misalignment in an etch stop-less integration, wherein the control system is programmed to use the etcher to sequentially perform at least three timed etch operations comprising: (1) removing a first portion of the dielectric material to form a hole in the dielectric material, (2) performing an inward tapering etch that removes a second portion of the dielectric material below the first portion to form the via, the via touching down on the conductive material and having a depth, and (3) laterally expanding a bottom dimension of the via without significant increase in the depth of the via; wherein the operations (1), (2) and (3) are performed in this specific order.

2. The system of claim 1, wherein the etcher comprises a parallel plate etcher.

3. The system of claim 1, wherein removing the first portion of the dielectric material comprises removing the first portion at a high etch rate, forming a substantially vertical sidewall profile that deviates less than fifteen degrees from vertical.

4. The system of claim 1, wherein performing the tapering etch comprises controlling ion bombardment and plasma chemistry to form a sloped bottom of the via.

5. The system of claim 1, wherein laterally expanding the bottom dimension of the via comprises performing an intensive ion bombarding plasma etch.

6. The system of claim 1, wherein the conductive material comprises a metal material.

7. The system of claim 1, wherein the dielectric material comprises a low dielectric constant dielectric material.

8. A system comprising:
an etcher; and
a control system programmed to use the etcher to form a via of less than three hundred and fifty nanometers in width through a dielectric material to a conductive material by sequentially performing at least three timed etch operations comprising: 1) removing a first portion of the dielectric material at a high etch rate to form a hole in the dielectric material, 2) performing an inward tapering etch that removes a second portion of the dielectric material below the first portion to form the via by controlling ion bombardment and plasma chemistry to form a sloped bottom of the via, the via touching down on the conductive material and having a depth, and 3) laterally expanding a bottom dimension of the via with an ion bombarding plasma etch without significant increase in the depth of the via;
wherein the operations 1), 2) and 3) are performed in this specific order.

9. The system of claim 8, wherein the dielectric material comprises a low dielectric constant dielectric material.

10. The system of claim 9, wherein the etcher comprises a parallel plate etcher.

* * * * *